US012615989B2

(12) United States Patent
Rudhard

(10) Patent No.: US 12,615,989 B2
(45) Date of Patent: Apr. 28, 2026

(54) DEVICE AND METHOD FOR PROCESSING AT LEAST ONE SEMICONDUCTOR SUBSTRATE

(71) Applicant: Robert Bosch GmbH, Stuttgart (DE)

(72) Inventor: Joachim Rudhard, Leinfelden-Echterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 325 days.

(21) Appl. No.: 17/770,381

(22) PCT Filed: Dec. 1, 2020

(86) PCT No.: PCT/EP2020/084030
§ 371 (c)(1),
(2) Date: Apr. 20, 2022

(87) PCT Pub. No.: WO2021/110631
PCT Pub. Date: Jun. 10, 2021

(65) Prior Publication Data
US 2022/0359216 A1     Nov. 10, 2022

(30) Foreign Application Priority Data

Dec. 3, 2019   (DE) ..................... 10 2019 218 727.7

(51) Int. Cl.
*H01J 37/32*          (2006.01)
*H01L 21/67*          (2006.01)
(52) U.S. Cl.
CPC .. *H01L 21/67069* (2013.01); *H01L 21/67017* (2013.01); *H01L 21/67109* (2013.01)
(58) Field of Classification Search
CPC ......... H01L 21/67069; H01L 21/67017; H01L 21/67109
See application file for complete search history.

(56) References Cited

U.S. PATENT DOCUMENTS

| | | | |
|---|---|---|---|
| 5,580,421 A | 12/1996 | Hiatt et al. | |
| 5,914,000 A | 6/1999 | Takahashi | |

(Continued)

FOREIGN PATENT DOCUMENTS

| | | | |
|---|---|---|---|
| CN | 101026096 A | 8/2007 | |
| CN | 101473419 A | 7/2009 | |

(Continued)

OTHER PUBLICATIONS

English translation of IDS filled JP 2004281620 A (Year: 2024).*
International Search Report for PCT/EP2020/084030, Issued Feb. 23, 2021.

*Primary Examiner* — Aiden Lee
(74) *Attorney, Agent, or Firm* — NORTON ROSE FULBRIGHT US LLP

(57)          ABSTRACT

A device for processing at least one semiconductor substrate. The device includes: a reactor with a wall which encloses a reaction chamber; a closing structure for loading the reaction chamber with at least one semiconductor substrate and for unloading the at least one semiconductor substrate from the reaction chamber and for hydrofluoric acid-tight closure of the reaction chamber; and a heating device designed to establish at least one specified temperature in at least one temperature range in the reaction chamber. The device further includes: a gas inlet designed to supply hydrofluoric acid in vapor form to the reaction chamber, and a gas outlet designed to remove hydrofluoric acid in vapor form from the reaction chamber; and a gas supply system which is coupled to the gas inlet and is designed to supply hydrofluoric acid in vapor form to the gas inlet at the specified temperature.

12 Claims, 3 Drawing Sheets

(56)     References Cited

U.S. PATENT DOCUMENTS

| | | | |
|---|---|---|---|
| 6,271,143 | B1 | 8/2001 | Mendicino |
| 6,383,300 | B1 | 5/2002 | Saito et al. |
| 2004/0040573 | A1 | 3/2004 | Bergman et al. |
| 2011/0068431 | A1 | 3/2011 | Knorr et al. |
| 2013/0175241 | A1 | 7/2013 | Yamaguchi et al. |
| 2017/0243753 | A1 | 8/2017 | Imai et al. |
| 2018/0088100 | A1* | 3/2018 | Yamada ........... G01N 23/20033 |
| 2018/0308707 | A1* | 10/2018 | Yamaguchi ....... H01L 21/31122 |
| 2019/0311955 | A1 | 10/2019 | Xu et al. |

FOREIGN PATENT DOCUMENTS

| | | | |
|---|---|---|---|
| CN | 104867845 | A | 8/2015 |
| CN | 205329160 | U | 6/2016 |
| DE | 4417205 | A1 | 11/1994 |
| DE | 102018107041 | A1 | 2/2019 |
| DE | 102017223600 | A1 | 6/2019 |
| JP | S54125144 | A | 9/1979 |
| JP | S54132164 | A | 10/1979 |
| JP | 2001015481 | A | 1/2001 |
| JP | 2002075954 | A | 3/2002 |
| JP | 2004281620 | A | 10/2004 |
| JP | 2009283725 | A | 12/2009 |
| JP | 2012004272 | A | 1/2012 |
| JP | 2018186149 | A | 11/2018 |
| WO | 2019019939 | A1 | 1/2019 |

* cited by examiner

300 load the reaction chamber and close it — 310 thermal oxidation — 320

350 — remove part of the oxidized semiconductor material — 330 unload reaction chamber — 340

DEVICE AND METHOD FOR PROCESSING AT LEAST ONE SEMICONDUCTOR SUBSTRATE

FIELD

The present invention relates to a device and to a method for processing at least one semiconductor substrate.

BACKGROUND INFORMATION

As progress is made toward electromobility in the automotive field, there is a need for solutions for providing rapidly and losslessly switching power semiconductors. The simultaneous trend from lateral to vertical components and the trend seen in silicon technology, which has been established for decades, toward "wide band gap" materials, for example silicon carbide (SiC) or gallium nitride (GaN), has led to the development of new component concepts and manufacturing processes.

In the case of SiC, the greatest possible use is made of systems taken from silicon technology. Thanks to synergistic effects, this consequently leads to capital cost savings. Independently thereof, certain systems and processes, in particular high-temperature processes, such as for example oxidation and dopant activation, are specifically tailored to silicon carbide.

Very thin, free-standing structures (semiconductor fins) with thicknesses ranging from 100 nm to 200 nm are needed to fabricate the power semiconductor components known in the literature as "FinFETs" from silicon carbide. One possible, simple fabrication method provides for the creation of a patterned grid using a suitable dry-etching process. However, this process alone is not sufficient for creation of the thin structures, meaning that in a subsequent fin-forming process the structures which have arisen in the respective grid are further thinned. This method includes cycles of oxidation and subsequent removal of the resultant SiC oxide, for example in a tank of aqueous hydrofluoric acid. This sequence of steps is repeated as a function of the initial grid and the desired final thickness of the semiconductor fins, resulting in logistical handling, transfer and system management costs.

SUMMARY

It is an object of the present invention to provide a device and a method which enable more cost-effective processing of one or more semiconductor substrates. This allows for more cost-effective fabrication of semiconductor components, for example vertical field-effect transistors, for example FinFETs.

The object may be achieved according to one aspect of the present invention by a device for processing at least one semiconductor substrate. In accordance with an example embodiment of the present invention, the device includes: a reactor with a wall which encloses a reaction chamber, a closing structure which is designed for loading the reaction chamber with at least one semiconductor substrate and for unloading the at least one semiconductor substrate from the reaction chamber and for hydrofluoric acid-tight closure of the reaction chamber, and a heating device which is designed to establish at least one specified temperature in at least one temperature range in the reaction chamber. The device furthermore includes a gas inlet which is designed to supply hydrofluoric acid in vapor form to the reaction chamber, a gas outlet which is designed to remove hydrofluoric acid in vapor form from the reaction chamber, and a gas supply system which is coupled to the gas inlet and is designed to supply hydrofluoric acid in vapor form to the gas inlet at the specified temperature. This enables minimization of total logistical costs and optional waiting times until system readiness.

The object may also be achieved according to a further aspect of the present invention by a method for processing at least one semiconductor substrate using a device configured according to the above-described aspect. In accordance with an example embodiment of the present invention, the method includes: a cycle comprising thermal oxidation of the at least one semiconductor substrate in the reaction chamber and subsequent removal of part of the oxidized semiconductor material of the at least one semiconductor substrate using hydrofluoric acid supplied by the gas inlet, wherein the cycle is run through at least twice, wherein the closing structure remains closed from the start of the first run through the cycle to the end of the last run through the cycle. This enables minimization of total logistical costs and optional waiting times until system readiness. In the method for fabricating a FinFET, the complete fin-forming process is for example possible in one method step in one system, allowing savings to be made in capital and system costs. In addition, repeated system changeovers may be prevented or reduced, so reducing logistics costs and saving on production time. In combination with surface masking to form the fins of the semiconductor fin geometry, better process control may additionally be possible. Moreover, the device may provide an instrument for detailed "form-shaping".

Further developments of the aspects of the present invention are disclosed herein. Example embodiments of the present invention are explained in greater detail below and illustrated in the figures.

DETAILED DESCRIPTION OF EXAMPLE EMBODIMENTS

In the following detailed description, reference is made to the figures, which form part of this description and which, for the purpose of illustration, show specific exemplary embodiments in which the present invention may be implemented. It goes without saying that other exemplary embodiments may also be used and structural or logical modifications may be made without deviating from the scope of protection of the present invention. It goes without saying that the features of the various exemplary embodiments described herein may be combined together if not specifically stated otherwise. The following detailed description should therefore not be understood as limiting. In the figures, identical or similar elements are provided with identical reference signs insofar as is expedient.

Figure 1:
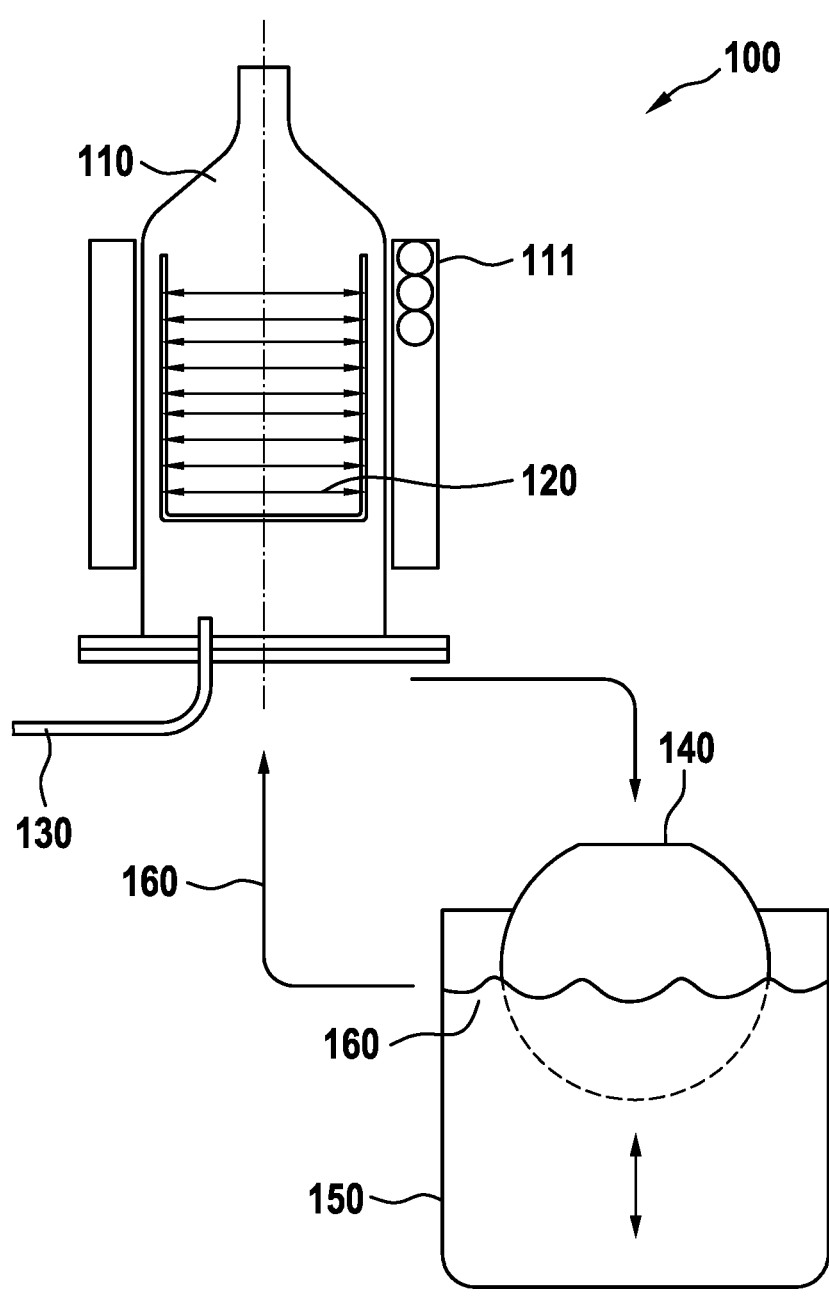
FIG. 1 is a schematic representation of a sequence of a method for processing at least one semiconductor substrate, in accordance with an example embodiment of the present invention.

One possibility for producing the thin semiconductor fins (100 nm to 200 nm lateral pattern width) in a FinFET includes the cyclic sequence of oxidation and removal of the resultant oxide, as illustrated schematically in FIG. 1. Here, an appropriate first initial grid is patterned into the semiconductor substrate, for example a trench structure in an SiC substrate. Starting from this profile, an oxidation process takes place, for example in a high-temperature oxidation system 100. The high-temperature oxidation system 100 includes a reactor 110 of quartz or silicon carbide, an adjustable heating device 111, an device 130 for the gas supply unit and silicon carbide substrates 120 in a holder or substrate carrier (also known as a boat) during the process and during substrate handling.

After oxidation and transfer 140 of the semiconductor substrates, the oxide is removed wet-chemically in a hydrofluoric acid-containing solution 160, conventionally for example in a dip tank 150. Due to self-limitation of the oxide during the oxidation process, it may be advantageous and necessary owing to economic considerations, but also for processing reasons, to run through this process repeatedly in a cycle, as indicated by arrows 140 and 160. This leads to repeated additional logistics costs and optional time delays due to the necessary system changeover at 140 and 160.

For the process it is substantially immaterial whether the oxidation system is vertical or horizontal. The furnace may alternatively be horizontally embodied, as illustrated in FIG. 2.

Figure 2:
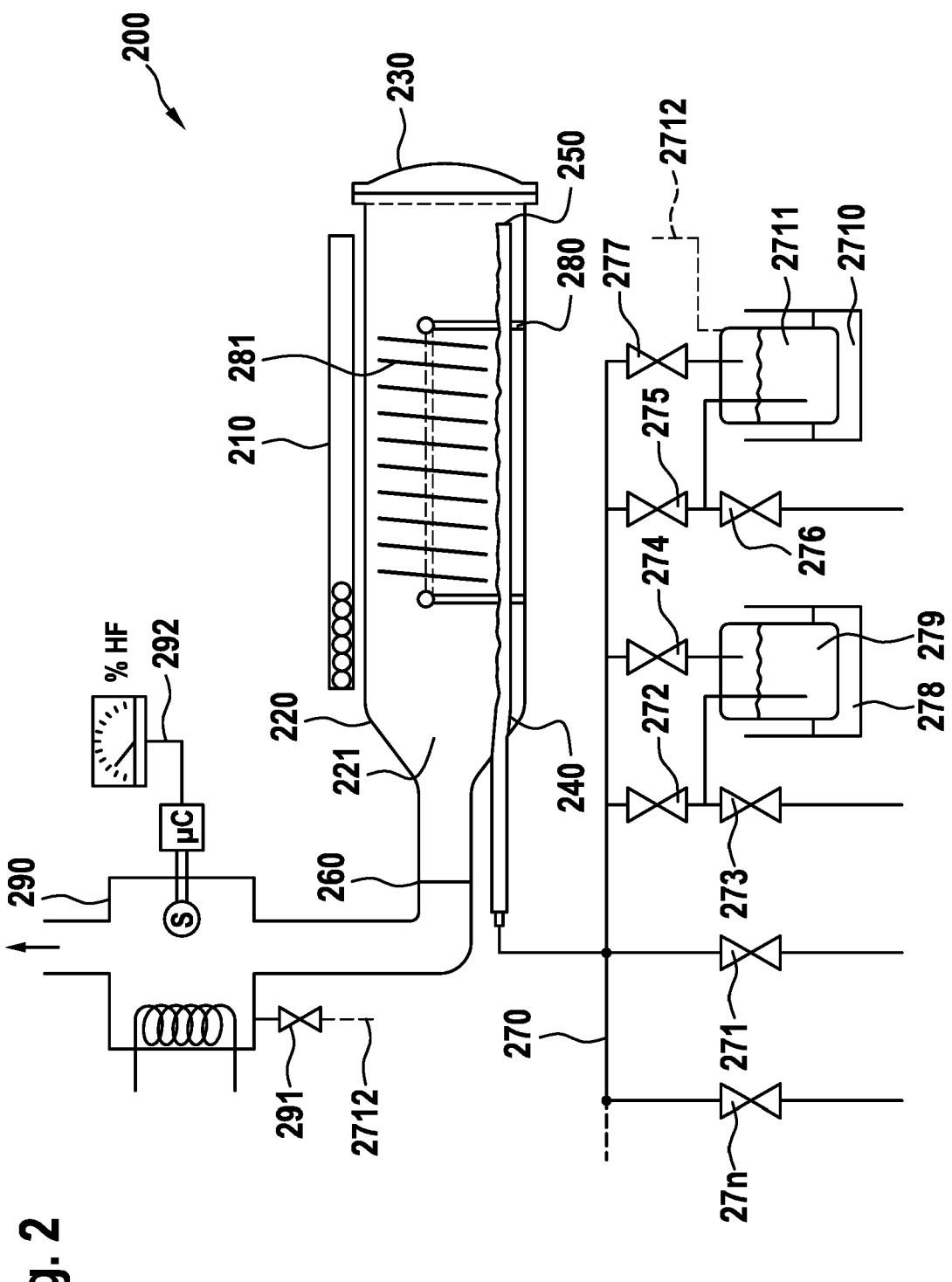
FIG. 2 is a schematic representation of a device for processing at least one semiconductor substrate according to various example embodiments of the present invention.

FIG. 2 shows a schematic representation of a device 200 for processing at least one semiconductor substrate 281 according to various embodiments. The device 200 includes a reactor 220, a gas inlet 240, 250, a gas outlet 260 and a gas supply system 270.

The reactor 220 includes a wall, a closing structure 230 and a heating device 210. The wall encloses a reaction chamber 221. The closing structure 230 is designed for loading the reaction chamber 221 with one or more semiconductor substrates 281 and for unloading the one or more semiconductor substrates 281 from the reaction chamber 221 and for hydrofluoric acid-tight closure of the reaction chamber 221. The heating device 210 is designed to establish at least one specified temperature in at least one temperature range in the reaction chamber 221. The specified temperature is higher than room temperature or may be higher than the temperature at which the reaction chamber 221 is loaded with the semiconductor substrate 281. The heating device 210 may be designed to adjust the specified temperature in the reaction chamber 221 to a temperature in a first temperature range, in which the at least one semiconductor substrate is at least thermally oxidized, for example in a temperature range which extends from approximately 900° C. to approximately 1400° C. The heating device 210 may furthermore be designed to adjust the specified temperature in the reaction chamber 221 to a temperature in a second temperature range, which extends from approximately 60° C. to approximately 600° C., for example 200° C. to 400° C.

The gas inlet 240, 250 is designed at least to supply the reaction chamber 221 with hydrofluoric acid in vapor form (hydrofluoric acid vapor). The gas outlet 260 is designed to remove hydrofluoric acid in vapor form from the reaction chamber 221. The gas supply system 270 is coupled to the gas inlet 240, 250 and designed to supply at least hydrofluoric acid in vapor form at the specified temperature to the gas inlet 240, 250.

The wall, the closing structure 230, the gas inlet 240, 250 and the gas outlet 260 may moreover be designed such that the hydrofluoric acid is supplied in vapor form at the specified temperature to the gas inlet 240, 250 by the gas supply system 270. The wall, the closing structure 230, the gas inlet 240, 250 and the gas outlet 260 may in each case be formed of a non-oxidizing or poorly oxidizing, hydrofluoric acid-resistant or substantially hydrofluoric acid-resistant material.

The device 200 may furthermore include a cold trap 290, which is coupled with the gas outlet 260. The cold trap 290 can be coupled in such a way to the gas supply system 270 that liquid hydrofluoric acid is supplied from the cold trap 290 to the gas supply system 270. The cold trap 290 may include a detection device 292, which is designed to detect hydrofluoric acid.

The device 200 may furthermore include a vacuum pump system, which is coupled to the reactor 220 in such a way that an underpressure or vacuum may be established in the reaction chamber 221.

The heating device 210 may be arranged outside the reaction chamber of the reactor 200. The reactor 200 may for example include a muffle furnace, wherein the reaction chamber 221 is the combustion material chamber and the wall is the muffle. The heating device may in the simplest case be an electrical resistance heater. This may be subdivided into a plurality of zones. Thermocouples may be arranged at a suitable point and appropriate heating adjustment may ensure the desired temperature distribution over the tube. By calibrating inside and outside temperatures it is possible to dispense with an internal thermocouple.

The wall may be designed as a tube or processing tube. A processing tube of silicon carbide or of a non-oxidizing and hydrofluoric acid-resistant material, for example a ceramic, may be provided in the furnace. The processing tube has an appropriate door closure or tube closure, i.e. a closing structure for loading and unloading the semiconductor substrates into or out of the processing tube. Alternatively, a tube of silicon carbide with an internal tube (also known as a liner) may also be used. The liner may be made, for example, of silicon carbide, a ceramic or sintered boron nitride, or the like. This may increase the service life of the device.

The gas inlet 240, 250 may include one or more gas lances 240, 250, which are designed to distribute at least hydrofluoric acid in vapor form in the reaction chamber.

The reactor 220 and all the hot components exposed to the process gases, for example the closing structure 230, the gas lance 240 or 250, the region of the gas outlet 260 and the substrate carrier 280 shown in the reactor may be made of silicon carbide or alternatively made wholly or in part of ceramics or coated with ceramics. Alternatively, other materials may be considered if appropriate and suitable for the process temperatures (for example up to 1350° C.) and gas atmospheres used (nitrogen, argon, nitrous oxide, oxygen, dry and wet (with water), and hydrofluoric acid-containing vapor phase).

In the various embodiments, the gas supply system 270 includes a plurality of valves 271, 272, 273, 274, 275, 276, 277, 27n and bubbler systems 278, 2710. The valves 271, 272, 273, 274, 275, 276, 277, 27n may introduce various process gases directly and/or by means of a carrier gas into the reaction chamber 221. Driving of the valves may be programmed with an appropriate control device with an appropriate computer-readable medium.

Nitrogen may for example be used as the carrier gas, being introduced into the reaction chamber 221 for example using the bubbler 278 with dichloroethane (DCE) or deionized (DI) water 279. Alternatively or in addition, the carrier gas (for example nitrogen) may be conveyed through a hydrofluoric acid-containing solution 2711 using the bubbler

2710 and then the carrier gas may be conveyed into the reactor chamber 221 together with the hydrofluoric acid entrained by the carrier gas.

The line arrangement of the gas supply system 270 may be designed, outside the regions exposed to heat (T<60° C.), with chemically resistant hoses, for example of Teflon-containing materials.

The cold trap 290 may be connected to the gas supply system 270 using a return line 2712. The cold trap 290 is designed to cool hydrofluoric acid-containing constituents from the exhaust gas. Liquid hydrofluoric acid may be recirculated from the cold trap 290 through a valve 291 and the return line 2712 into the corresponding bubbler 2710.

The return line 2712 is chemically resistant or is coated accordingly. The cold trap 290 may furthermore contain, for safety engineering purposes, a detection device 292, for example a sensor and evaluation unit, for hydrofluoric acid or hydrofluoric acid vapors.

Figure 3:
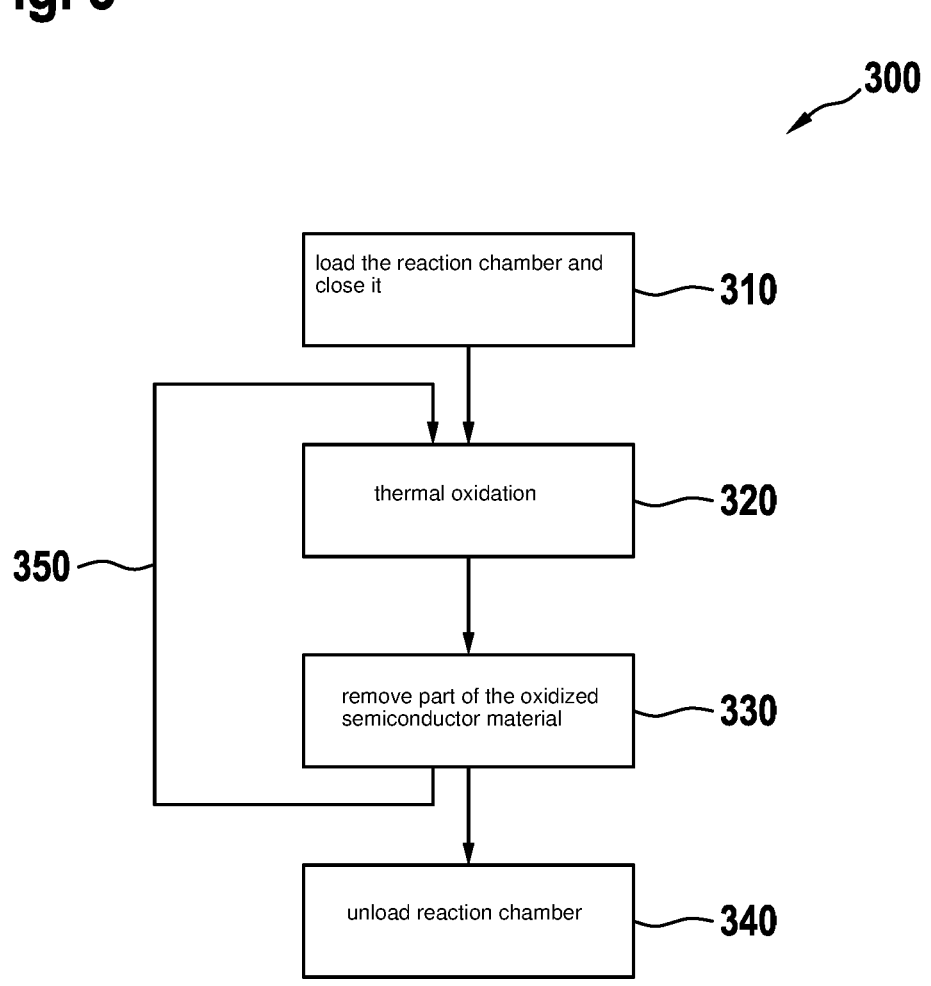
FIG. 3 is a flow chart of a method for processing at least one semiconductor substrate according to various example embodiments of the present invention.

FIG. 3 shows a flow chart of a method 300 for processing at least one semiconductor substrate according to various embodiments. The method 300 may be carried out using a previously described device 200.

The method 300 may include loading 310 the reaction chamber with at least one semiconductor substrate and closure of the closing structure. The closing structure is closed in such a way that the reaction chamber or the contact region is closed off tightly against hydrofluoric acid in vapor form by the wall and closing structure.

The method 300 further includes a cycle 350. The cycle 350 includes thermal oxidation 320 of the at least one semiconductor substrate in the reaction chamber and subsequent removal 330 of part of the oxidized semiconductor material of the at least one semiconductor substrate using hydrofluoric acid supplied by the gas inlet. The cycle 350 is run through at least twice. The cycle 350 may be repeated sufficiently often for a specified amount of material to be removed from the at least one semiconductor substrate.

The method 300 may further include opening of the closing structure and unloading 340 of the at least one semiconductor substrate from the reaction chamber. Prior to opening of the closing structure, the method may include the detection of hydrofluoric acid in the gas received by the gas outlet. If no hydrofluoric acid is detectable in the gas received by the gas outlet, the closing structure may be released for opening.

The closing structure clearly remains closed from the start of the first run through the cycle 350 to the end of the last run through the cycle 350.

The "fin-forming process" during fabrication of FinFETs aims to generate vertical structures with a thickness of 100-200 nanometers by cyclic oxidation and subsequent removal of the oxide formed. This method of cyclic oxidation and subsequent removal of the resultant oxidized silicon carbide is carried out in situ in the reaction chamber of the device in a continuous processing sequence.

The method then includes oxidation and removal of the semiconductor oxide formed by oxidation, for example oxidation of a silicon carbide substrate and removal of the oxidized silicon carbide from the silicon carbide substrate.

At the starting point of the method, the silicon carbide substrates are present in wafer form with a patterned grid (trench structure). This grid may be created with the appropriate patterning depth using a dry-etching process.

The semiconductor substrates used, for example wafers with a thickness in the range of a few hundred micrometers, are held in the substrate carrier, or "boat", for the entire processing sequence. The substrate carrier may be formed of silicon carbide or a ceramic (for example boron nitride).

The substrate carrier may be driven into the reactor or into an internal liner (of SiC or ceramics) using a mechanical positioning device and parked therein. This may proceed at a standby temperature as low as room temperature up to several hundred degrees Celsius (for example in a range from 60° C. to 600° C., for example 400° C. to 600° C.).

After loading 310, the reaction chamber is closed using the closing structure in such a way that no hydrofluoric acid can escape unintentionally from the reaction chamber.

The reaction chamber may be flushed with nitrogen using the gas supply system. Using the optional vacuum pump system, a combination of pumping and flushing cycles may optionally be run through during heating up to the specified temperature (process temperature) of the reaction chamber using the heating device. In the simplest case, during heating of the reaction chamber to the process temperature, the semiconductor substrates are flushed in an inert or indeed slightly oxidizing atmosphere. The gas supply system may provide the necessary gases for this purpose, for example nitrogen ($N_2$), argon (Ar), or $N_2$ with 1% oxygen ($O_2$), to the gas inlet.

Once the process temperature has been reached for oxidation (for example 1000° C.-1350° C. in the case of silicon carbide substrates) and subsequent temperature stabilization achieved, it is possible to change over from an inert to an oxidizing gas phase using the gas supply system.

The oxidizing gas phase may be dry or wet oxidation with or without additional chlorine, for example provided by a bubbler with trans-1,2-dichloroethylene (Trans-LC) or a substance with comparable properties, for example DCE.

Oxygen and oxygen as carrier gas through a bubbler (278) with DI water (279) may, for example, be used (see FIG. 2). Oxidation may be terminated after the appropriately set oxidation time. The reaction chamber may be flushed with an inert gas. In accordance with the known and/or previously determined oxidation rate and oxidation time, some of the silicon carbide of the semiconductor substrate may be oxidized and be present as silicon carbide oxide.

The reactor may then be flushed with inert gas and adjusted to the process temperature for the oxide etch step.

The oxide of the at least one semiconductor substrate is removed in a hydrofluoric acid-containing atmosphere. The process temperature may for example be left at the oxidation temperature, for example in the range from 1000° C. to 1350° C. Alternatively, for example to optimize process control, the specified temperature for the etch step may also be lower, for example a temperature in the temperature range from approximately 200° C. to approximately 400° C.

The necessary etching times may have been previously determined as a function of oxide thickness, the process temperature and the amount of hydrofluoric acid-containing solution supplied in vapor form and adjusted accordingly for the process.

The hydrofluoric acid in vapor form may be provided into the reaction chamber by the gas supply system. To this end, a carrier gas, for example $N_2$, may be fed via a bubbler system (2710) through an aqueous hydrofluoric acid-containing solution (2711) (see FIG. 2). The carrier gas stream (in the range from a few hundred standard cubic centimeters/minute up to a few standard liters/minute) may be guided via the gas supply system and gas lances of the gas inlet into the reaction chamber. The amount of hydrofluoric acid entrained with the carrier gas stream may be released in vapor form in the hot reaction chamber by the gas lances at the position of the substrate carrier. The hydrofluoric acid may then etch the previously oxidized regions of the silicon carbide wafer.

All the hot surfaces which come into contact with the hydrofluoric acid vapor may or should be made of resistant silicon carbide, the oxide of which may likewise be etched. Shrinkage of the oxidized SiC components may be kept low by suitable gas guidance, the use of a ceramic liner (wall) and regions lined with ceramic material and in addition by adapted temperature profiles and adapted amounts. Alternatively, the hot surfaces may be formed of an inert ceramic, for example boron nitride.

The hydrofluoric acid-containing residual gas stream may be fed through the gas outlet via the cold trap out of the reaction chamber to an exhaust means.

A multistage embodiment of the cold trap is also possible, as in a rectification column.

All (non-hot) components (for example T<60° C.) outside the regions which are (approximately) at process temperature may accordingly be embodied with a hydrofluoric acid-resistant coating, for example Teflon or the like, or be intrinsically resistant to hydrofluoric acid.

The cold trap may include a return device and/or a return line for condensed hydrofluoric acid vapor or liquid hydrofluoric acid. Depending on concentration, the hydrofluoric acid liquefied in the cold trap may be returned to the container (2711) of the bubbler system (2710) of the gas supply system using the return line (2712) (see FIG. 2).

The cold trap may include a detection device (292) with sensor for hydrofluoric acid and an evaluation unit (see FIG. 2). This detection device may be arranged at multiple different points and in this way ensure a successful flushing step prior to the next oxidizing process step or prior to unloading of the machined semiconductor substrates from the reactor.

Depending on the necessary and desired thinning of the vertical silicon carbide structures, processing of the semiconductor substrate may, with regard to overall process duration, run through a plurality of cycles 350. In this case, after the etching process and flushing out of the hydrofluoric acid-containing atmosphere out of the reaction chamber using inert gas, a renewed oxidation process may be started (see above), followed by a renewed etch step etc. In this regard, the number of cycles 350 and their duration is unlimited, and may be freely selected.

Once the desired oxide thickness has been generated and etching thereof is terminated, the reaction chamber may be flushed with an inert gas, for example N₂ or Ar. In addition, a specified unloading temperature may be established. Using a sensor for the hydrofluoric acid concentration of the detection device, successful flushing of the reaction chamber prior to opening thereof and unloading 340 of the substrate carrier with the semiconductor substrates may be checked and ensured. Additional exhaust systems and sensors may be provided at the opening region to comply with safety regulations.

In various embodiments, conditioning of the device may take place prior to further processing. For example, it may be advantageous for reproducibility of the method outcome if all the components consisting of silicon carbide include an oxide base layer. This may then be etched in cycles, and then recreated in the oxidation step.

This "oxide base layer" may for example be achieved by wafer-less oxidation. The components made of silicon carbide may be designed in such a way as to take account of the material shrinkage caused by etch-back. For example, the components may be provided with a reserve thickness, to ensure a sufficient service life for the components.

Through suitable process gas guidance in the region of the gas lances and appropriate gas volume management, the reserve thickness may optionally be retained only locally or at points. Alternatively, a tube ("liner") may be used, which is provided in the reactor as a muffle. Under certain circumstances, it is then possible for just the liners to be replaced once they have reached the end of their service life. Service life may also be increased by appropriate material selection. For instance, the substrate carrier and other components may be formed wholly or in part of ceramic material or for example sintered boron nitride.

In addition, a ceramic liner may be provided in the "hot region" of the reaction chamber. Alternatively, gas lances with ceramic cladding tubes or with ceramic coating may be used. Alternatively, a silicon carbide liner with reserve thickness may be provided, which is deliberately consumed and routinely replaced, so increasing the service life of the tube.

In various embodiments, apart from the patterned grid, a shaping mask may also additionally be provided on the semiconductor substrate as part of substrate pretreatment. The respective mask material may be designed to withstand the oxidation process and/or the etching process. In the case of silicon carbide substrates, the mask structure may be formed of silicon nitride, itself formed in a low-pressure gas-phase deposition (LPCVD) process. Silicon nitride has a low, self-limiting oxidation rate and, compared with silicon oxide, a markedly lower etching rate in hydrofluoric acid.

For application in the previously described device and the previously described method, it may be advantageous not to use a continuous, one-piece silicon nitride layer as mask structure. Alternatively, a layer stack of alternating silicon nitride and silicon-rich nitride, ending with silicon nitride, may be used as the mask structure. Silicon nitride has a lower oxidation rate in the oxidation process, and the silicon-rich nitride has a lower etch rate and thus a higher resistance to hydrofluoric acid-containing vapors due to its higher, adjustable silicon content. By adapting the layer thicknesses of the silicon-rich silicon nitride layer and silicon nitride layer, it is possible to obtain shaping mask structures which are thin overall and cost-effective. The layer stack consisting of silicon nitride layer and silicon-rich silicon nitride layer may be produced by varying the gas flow in an LPCVD process. A silicon-rich silicon nitride layer has a higher silicon content than a silicon nitride layer.

The embodiments described and shown in the figures are selected merely by way of example. Different embodiments may be combined with one another in full or in respect of individual features. One embodiment may also be supplemented with features of a further embodiment. Furthermore, described method steps may be repeated and performed in a sequence other than that described. In particular, the present invention is not limited to the stated method.

What is claimed is:

1. A device for processing at least one semiconductor substrate, the device comprising:
a hydrofluoric acid source that has hydrofluoric acid;
a carrier gas source that has a carrier gas;
an oxygen source that has oxygen;
a valve system to which the hydrofluoric acid source, the carrier gas source, and the oxygen source are coupled;
a reactor including a wall which encloses a reaction chamber in which the at least one semiconductor substrate is oxidizable and etchable using the hydrofluoric acid, which is provided from the hydrofluoric acid source (I) using the carrier gas from the carrier gas source and (II) via the valve system;

a closing structure:
  (I) which is transitionable between open and closed states of the closing structure;
  (II) which is arranged at a first side of the reactor;
  (III) via which the at least one semiconductor substrate is loadable into the reaction chamber and unloadable from the reaction chamber while the closing structure is in the open state; and
  (IV) (i) into which the at least one semiconductor substrate is not loadable and (ii) from which the at least one semiconductor substrate is not unloadable while the closing structure is in the closed state;

a heating device configured to establish at least one specified temperature in at least one temperature range in the reaction chamber;

a gas inlet to which the valve system is coupled and that is configured to supply the hydrofluoric acid, provided to the gas inlet at the specified temperature via the valve system, in vapor form to the reaction chamber;

a computer system including a processor programmed to control the valve system to introduce the oxygen from the oxygen source to oxidize the substrate via the valve system prior to being etched using the hydrofluoric acid;

a gas outlet: (I) which is at a second side of the reactor, such that the at least one semiconductor substrate, when in the reactor, is situated between the closing structure and the gas outlet, and (II) via which the hydrofluoric acid is removable in vapor form from the reaction chamber; and a hydrofluoric acid detector;

wherein:
  the hydrofluoric acid detector is arranged relative to the reactor such that hydrofluoric acid present at the gas outlet is detectable by the hydrofluoric acid detector; and
  the processor is programmed to release the closing structure to be openable from the closed state into the open state in response to the hydrofluoric acid detector detecting that hydrofluoric acid at the gas outlet is absent or present only below a threshold.

2. The device as recited in claim 1, wherein the heating device is configured to adjust the specified temperature in the reaction chamber to stabilize at a temperature in a first temperature range, in which the semiconductor substrate is at least thermally oxidized.

3. The device as recited in claim 2, wherein the first temperature range extends from approximately 900° C. to approximately 1400° C.

4. The device as recited in claim 3, wherein the heating device is further configured to adjust the specified temperature in the reaction chamber also to stabilize at a temperature in a second temperature range, which extends from approximately 60° C. to approximately 400° C.

5. The device as recited in claim 1, wherein the wall, the closing structure, the gas inlet, and the gas outlet are configured such that the hydrofluoric acid is supplied in vapor form at the specified temperature to the gas inlet by the gas supply system.

6. The device as recited in claim 1, wherein the wall, the closing structure, the gas inlet, and the gas outlet are each formed from a material that is non-oxidizing and hydrofluoric acid-resistant.

7. The device as recited in claim 1, further comprising a cold trap, which is coupled to the gas outlet.

8. The device as recited in claim 7, wherein the cold trap is coupled in such a way to the gas supply system that liquid hydrofluoric acid is supplied from the cold trap to the gas supply system.

9. The device as recited in claim 7, wherein the hydrofluoric acid detector is arranged at or in the cold trap.

10. The device as recited in claim 1, further comprising:
  a vacuum pump system, which is coupled to the reactor in such a way that an underpressure or vacuum may be established in the reaction chamber.

11. The device as recited in claim 1, wherein the at least one semiconductor substrate includes a mask structure, wherein the mask structure includes a layer stack of a silicon nitride layer and a silicon-rich silicon nitride layer.

12. A method for processing at least one semiconductor substrate using a device including:
  a hydrofluoric acid source that has hydrofluoric acid;
  a carrier gas source that has a carrier gas;
  an oxygen source that has oxygen;
  a valve system to which the hydrofluoric acid source, the carrier gas source, and the oxygen source are coupled;
  a reactor including a wall which encloses a reaction chamber in which the at least one semiconductor substrate is oxidizable and etchable using the hydrofluoric acid, which is provided from the hydrofluoric acid source (I) using a carrier gas from the carrier gas source and (II) via the valve system;
  a closing structure:
    (I) which is transitionable between open and closed states of the closing structure;
    (II) which is arranged at a first side of the reactor;
    (III) via which the at least one semiconductor substrate is loadable into the reaction chamber and unloadable from the reaction chamber while the closing structure is in the open state; and
    (IV)(i) into which the at least one semiconductor substrate is not loadable and (ii) from which the at least one semiconductor substrate is not unloadable while the closing structure is in the closed state;
  a heating device configured to establish at least one specified temperature in at least one temperature range in the reaction chamber;
  a gas inlet to which the valve system is coupled and that is configured to supply the hydrofluoric acid, provided to the gas inlet at the specified temperature via the valve system, in vapor form to the reaction chamber;
  a computer system including a programmed processor;
  a gas outlet: (I) which is at a second side of the reactor, such that the at least one semiconductor substrate, when in the reactor, is situated between the closing structure and the gas outlet, and (II) via which the hydrofluoric acid is removable in vapor form from the reaction chamber; and
  a hydrofluoric acid detector;
  wherein;
    the hydrofluoric acid detector is arranged relative to the reactor such that hydrofluoric acid present at the gas outlet is detectable by the hydrofluoric acid detector;
    the method comprises a cycle including thermally oxidating the at least one semiconductor substrate in the reaction chamber and subsequently removing of part of the oxidized semiconductor material of the at least one semiconductor substrate using hydrofluoric acid supplied through the gas inlet;
    the cycle is run through at least twice and the thermal oxidation is performed by the processor controlling the valve system to introduce the oxygen from the oxygen source that is provided via the valve system prior to the removal;

the removal is performed by etching using the hydrofluoric acid;

the closing structure remains closed from a start of a first run through the cycle to the end of a last run through the cycle; and the method further comprises releasing, by the processor, the closing structure to be openable from the closed state into the open state in response to the hydrofluoric acid detector detecting that hydrofluoric acid at the gas outlet is absent or present only below a threshold.

* * * * *